US009219017B2

(12) United States Patent
Takagi

(10) Patent No.: US 9,219,017 B2
(45) Date of Patent: Dec. 22, 2015

(54) RADIO FREQUENCY SEMICONDUCTOR DEVICE PACKAGE AND METHOD FOR MANUFACTURING SAME, AND RADIO FREQUENCY SEMICONDUCTOR DEVICE

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/637,581

(22) Filed: Mar. 4, 2015

(65) Prior Publication Data

US 2015/0262901 A1    Sep. 17, 2015

(30) Foreign Application Priority Data

Mar. 12, 2014    (JP) ................................. 2014-049335

(51) Int. Cl.
| | | |
|---|---|---|
| H01L 23/04 | (2006.01) | |
| H01L 23/047 | (2006.01) | |
| H01L 23/06 | (2006.01) | |
| H01L 21/48 | (2006.01) | |
| H01L 23/66 | (2006.01) | |
| B23K 1/00 | (2006.01) | |
| B23K 1/20 | (2006.01) | |
| B23K 35/30 | (2006.01) | |

(52) U.S. Cl.
CPC ............ *H01L 23/047* (2013.01); *B23K 1/0016* (2013.01); *B23K 1/20* (2013.01); *B23K 35/3006* (2013.01); *H01L 21/4817* (2013.01); *H01L 23/06* (2013.01); *H01L 23/66* (2013.01)

(58) Field of Classification Search
CPC ................ H01L 23/66; H01L 2223/66; H01L 2924/1421
USPC ......................................................... 257/966
See application file for complete search history.

(56) References Cited

U.S. PATENT DOCUMENTS

| | | | |
|---|---|---|---|
| 4,547,624 A | 10/1985 | Tower et al. | |
| 4,698,661 A * | 10/1987 | Bessonneau | .......... H01L 23/647 257/664 |
| 2005/0242419 A1 | 11/2005 | Philliber | |

(Continued)

FOREIGN PATENT DOCUMENTS

| | | |
|---|---|---|
| JP | 2002-184888 A | 6/2002 |
| JP | 2012-38837 | 2/2012 |

(Continued)

OTHER PUBLICATIONS

Extended European Search Report issued May 11, 2015 in Patent Application No. 15157666.7.

*Primary Examiner* — Brook Kebede
(74) *Attorney, Agent, or Firm* — Oblon, McClelland, Maier & Neustadt, L.L.P.

(57) ABSTRACT

A radio frequency semiconductor device package includes a metal base plate, a first metal wall, a second metal wall, and feed-through parts. The first metal wall is provided with first and second openings and connected onto the metal base plate. The openings are set back from a lower surface side and do not reach an upper surface. The second metal wall is connected to the upper surface of the first metal wall. Thickness of the second metal wall is larger than thickness of the first metal wall. The feed-through parts include insulators and line patterns insulated from the first and second metal walls and are joined to inner walls of the openings and the metal base plate.

14 Claims, 9 Drawing Sheets

(56) References Cited

U.S. PATENT DOCUMENTS

2012/0126246 A1    5/2012  Takagi
2012/0234592 A1*   9/2012  Takagi .................. H01L 23/047
                                                          174/266
2013/0128489 A1    5/2013  Satake

FOREIGN PATENT DOCUMENTS

JP      2012-38837 A      2/2012
JP      2012-124477 A     6/2012
JP      2013-235913 A     11/2013

* cited by examiner

FIG. 8A
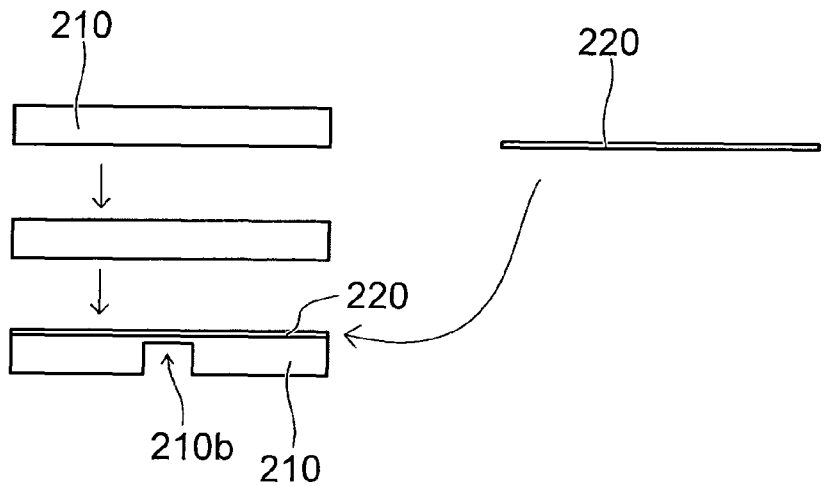
FIG. 8B
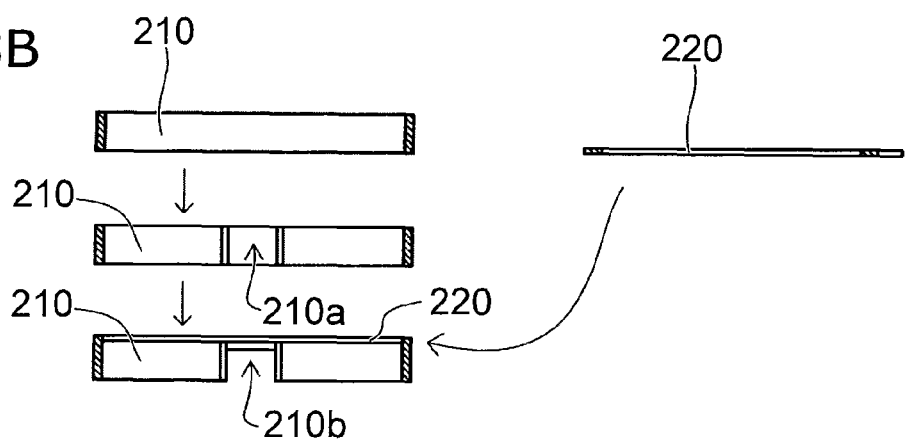
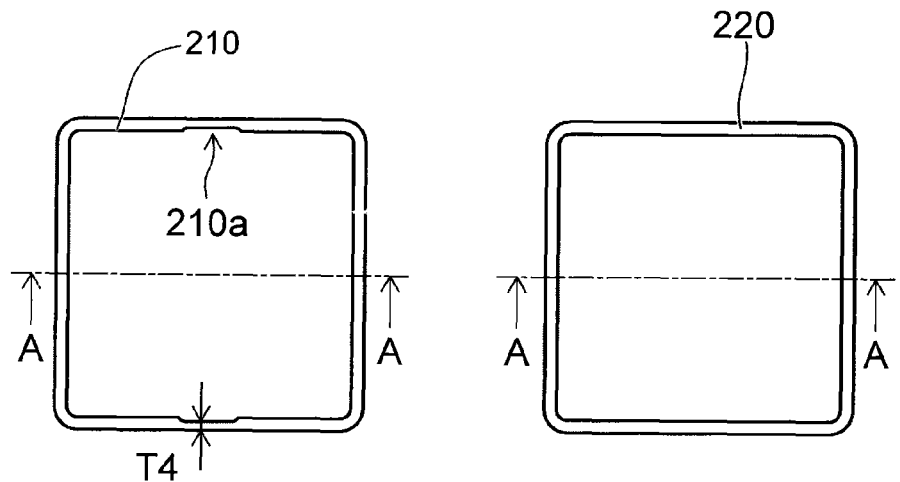
FIG. 8C          FIG. 8D

RADIO FREQUENCY SEMICONDUCTOR DEVICE PACKAGE AND METHOD FOR MANUFACTURING SAME, AND RADIO FREQUENCY SEMICONDUCTOR DEVICE

CROSS-REFERENCE TO RELATED APPLICATIONS

This application is based upon and claims the benefit of priority from Japanese Patent Application No.2014-049335, filed on Mar. 12, 2014; the entire contents of which are incorporated herein by reference.

FIELD

Embodiments described herein relate generally a radio frequency semiconductor device package and a method for manufacturing same, and a radio frequency semiconductor device.

BACKGROUND

Radio frequency semiconductor devices operated at 1 GHz or more are required to have high reliability while keeping their radio frequency characteristics.

The radio frequency characteristics can be kept at high level by reducing parasitic capacitance in the input line pattern and the output line pattern. However, the metal wall constituting the radio frequency semiconductor device package around the input line pattern and the output line pattern needs to be thinned in order to reduce the parasitic capacitance of the input line pattern and the output line pattern.

On the other hand, if the metal wall constituting the radio frequency semiconductor device package is thinned, a leakage path is likely to occur between the metal wall and the lid part soldered to the metal wall upper surface. Furthermore, the workability for soldering the lid part to the metal wall upper surface is deteriorated. As a result, a leakage path is likely to occur between the metal wall and the lid part. In order to improve airtightness and workability, the metal wall of the radio frequency semiconductor device package needs to be thickened.

BRIEF DESCRIPTION OF THE DRAWINGS

FIG. 8A is a schematic front view describing the step of forming a metal wall of the variation, FIG. 8B is a schematic sectional view describing the forming step, FIG. 8C is a schematic plan view of the first metal wall, and FIG. 8D is a schematic plan view of the second metal wall.

DETAILED DESCRIPTION

In general, according to one embodiment, a radio frequency semiconductor device package includes a metal base plate, a first metal wall, a second metal wall, a first feed-through part and a second feed-through part. The first metal wall is provided with first and second openings and connected onto the metal base plate. The first and second openings are set back from a lower surface side of the firs metal wall and do not reach an upper surface of the first metal wall. The second metal wall is connected to the upper surface of the first metal wall. The second metal wall is thicker than the first metal wall. The first feed-through part includes a first insulator and a first line pattern insulated from the first and second metal walls and is joined to an inner wall of the first opening and the metal base plate. The second feed-through part includes a second insulator and a second line pattern insulated form the first and second metal walls and is joined to an inner wall of the second opening and the metal base plate.

Embodiments of the invention will now be described with reference to the drawings.

Figure 1A:
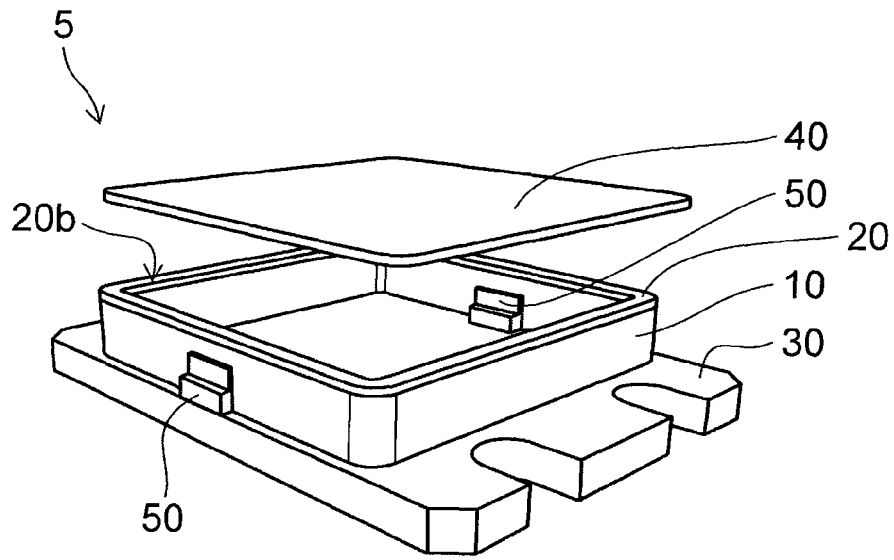
FIG. 1A is a schematic perspective view of a radio frequency semiconductor device package according to a first embodiment.
Figure 1B:
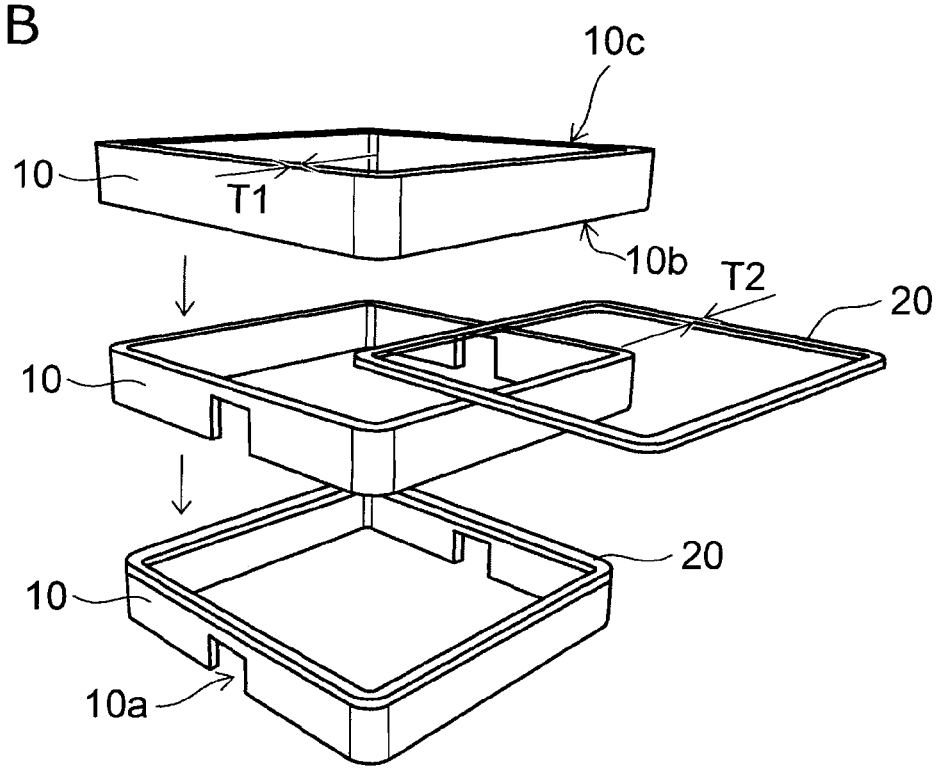
FIG. 1B is a schematic perspective view describing a step of forming a metal wall among the members thereof.

FIG. 1A is a schematic perspective view of a radio frequency semiconductor device package according to a first embodiment. FIG. 1B is a schematic perspective view describing the step of forming a metal wall among the members thereof.

The radio frequency semiconductor device package 5 includes a metal base plate 30, a first metal wall 10, a second metal wall 20, a first feed-through part 50 and a second feed-through part 50. Radio frequency can include microwave frequency in this specification.

The first metal wall 10 includes first and second openings 10a. The first metal wall 10 is joined onto the metal base plate 30. The first metal wall 10 has a uniform thickness T1. The first metal wall 10 is shaped like a ring. The openings 10a are set back from the lower surface 10b of the first metal wall 10 and do not reach the upper surface 10c.

The second metal wall 20 is joined to the upper surface 10c of the first metal wall 10. The second metal wall 20 has a uniform thickness T2 thicker than the thickness T1 of the first metal wall 10. The second metal wall 20 is shaped like a ring. The first and second metal walls 10, 20 can be made of a conductive metal such as Fe—Ni—Co, copper, aluminum, molybdenum, copper-tungsten alloy, copper-molybdenum laminate, and copper-molybdenum alloy.

The metal base plate 30 can be made of a conductive metal such as copper, copper-tungsten alloy, molybdenum and copper-molybdenum alloy. Furthermore, the surface of the metal base plate 30 may be a plating layer of e.g. gold, nickel, silver, silver-platinum alloy, or silver-palladium alloy.

The feed-through part 50 includes an insulator layer made of e.g. ceramic. The feed-through part 50 is joined to the inner wall of the opening 10a and the metal base plate 30. The feed-through part 50 includes a line pattern on the surface of the insulator layer.

The first metal wall 10, the second metal wall 20, and the feed-through part 50 are stacked on the metal base plate 30 and joined together to constitute the structure of FIG. 1A. The radio frequency semiconductor device package 5 can further include a lid part 40. The lid part 40 can be a metal plate or a ceramic plate. In the case of the metal plate, the lid part 40 can be made of a conductive metal such as Fe—Ni—Co, copper, molybdenum and copper-molybdenum alloy. In the case of the ceramic plate, the lid part 40 can be made of e.g. alumina or aluminum nitride.

Figure 2:
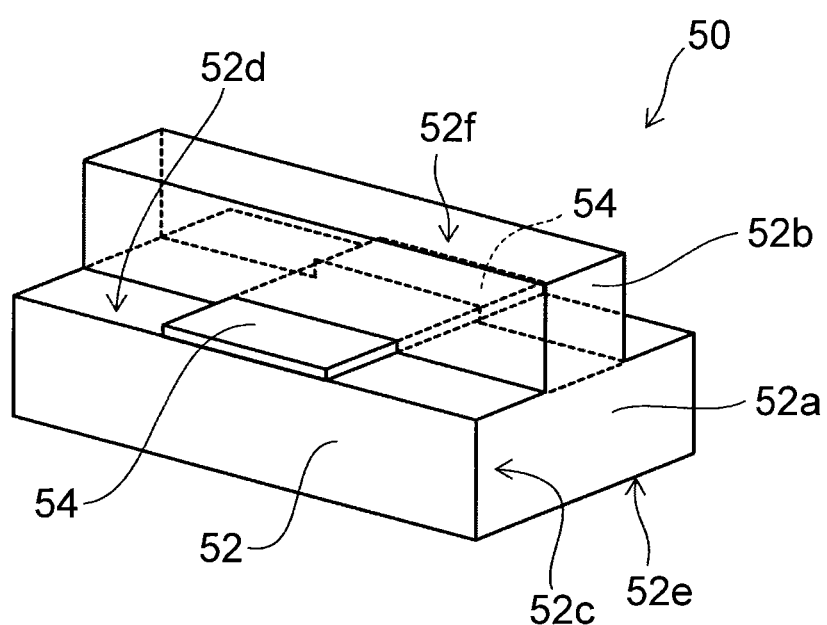
FIG. 2 is a schematic perspective view of the feed-through part.

FIG. 2 is a schematic perspective view of the feed-through part.

The feed-through part 50 includes an insulator 52, and a line pattern 54. The insulator 52 includes a lower insulator layer 52a and an upper insulator layer 52b. The upper insulator layer 52b is provided on the upper surface of the lower insulator layer 52a on which the line pattern 54 is provided. The lower insulator layer 52a and the upper insulator layer 52b are made of e.g. ceramic. The lower insulator layer 52a and the upper insulator layer 52b sandwiches a conductive region (such as a conductive film or paste) constituting the line pattern. The lower insulator layer 52a and the upper insulator layer 52b can be formed by e.g. a firing process.

The material of the ceramic can be e.g. alumina or aluminum nitride.

The line pattern 54 exposed at the surface can be provided with e.g. a plating layer of e.g. gold, nickel, silver, silver-platinum alloy, or silver-palladium alloy. A conductive region made of e.g. a conductive film may be provided on e.g. the side surface 52c, the bottom surface 52e, and the upper surface 52f of the feed-through part 50. This facilitates joining to the metal base plate 30 and the first metal wall 10.

Figure 3:
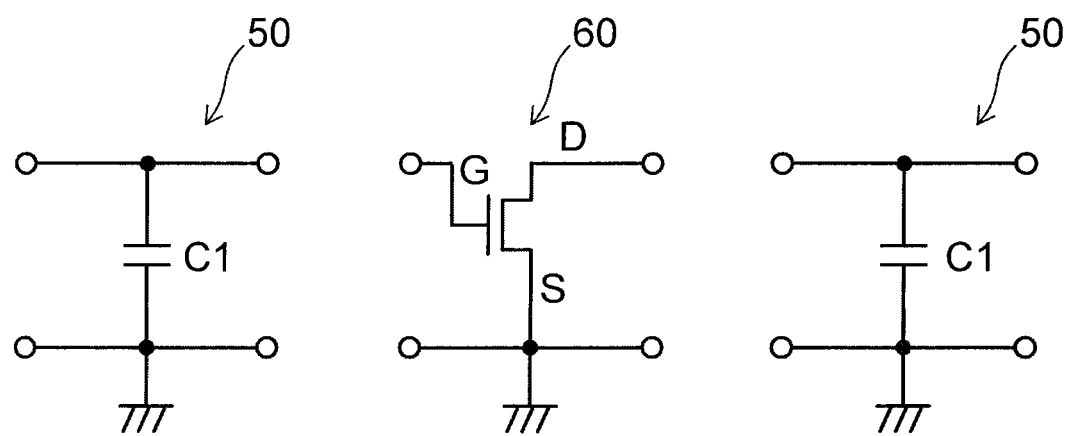
FIG. 3 is a radio frequency equivalent circuit diagram of the feed-through part.

FIG. 3 is a radio frequency equivalent circuit diagram of the feed-through part.

Parasitic capacitance C1 occurs between the line pattern 54 and grounded parts which are the metal base plate 30 or the metal wall 10 across the conductive region constituting the line pattern 54. The parasitic capacitance C1 increases with the increase of the thickness of the metal wall.

The radio frequency semiconductor element installed in the package 5 is connected to e.g. an input-side line pattern 50 or output-side line pattern 50 through an input circuit (not shown) or output circuit (not shown). In this case, the parasitic capacitance C1 is added in each case.

Figure 4A:
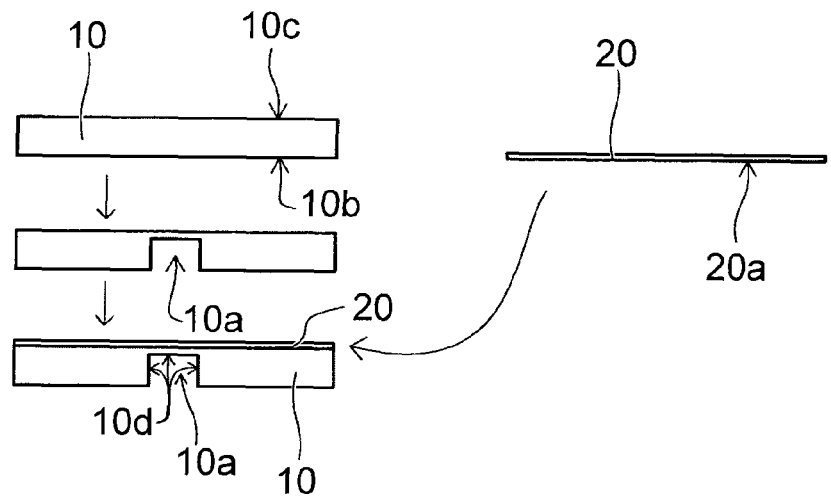
FIG. 4A is a schematic front view describing the step of forming a metal wall.
Figure 4B:
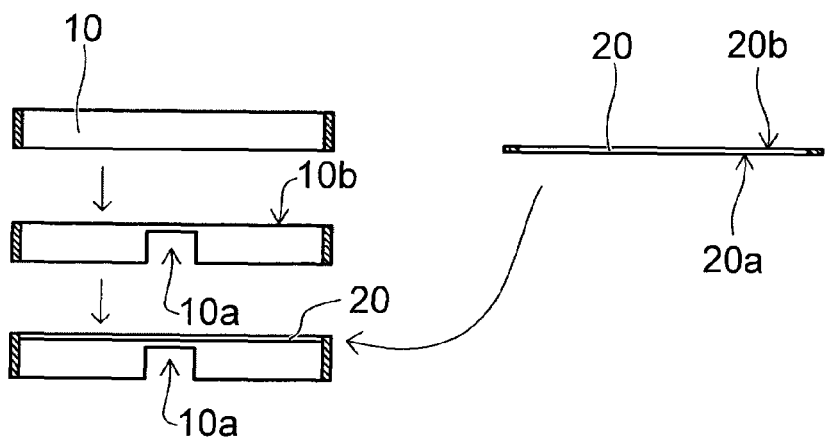
FIG. 4B is a schematic sectional view describing the step of forming a metal wall.
Figures 4C, 4D:
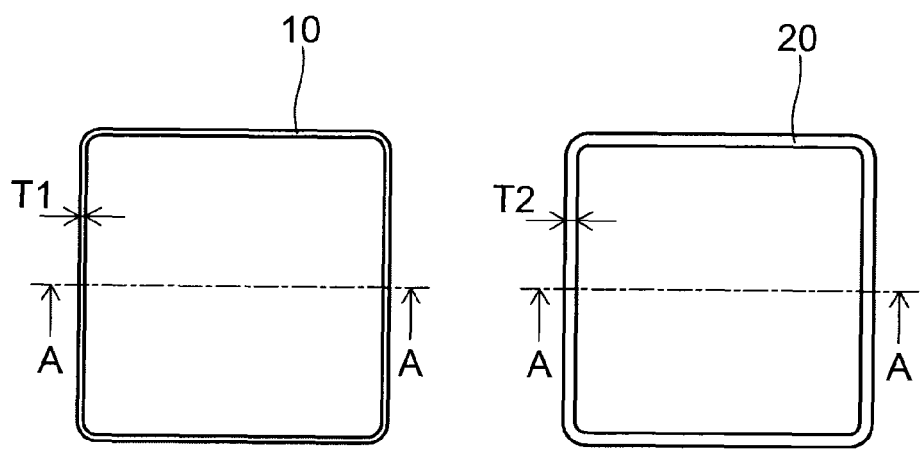
FIG. 4C is a schematic plan view of the first metal wall.
FIG. 4D is a schematic plan view of the second metal wall.

FIG. 4A is a schematic front view describing the step of forming a metal wall. FIG. 4B is a schematic sectional view describing the step of forming a metal wall. FIG. 4C is a schematic plan view of the first metal wall. FIG. 4D is a schematic plan view of the second metal wall.

Here, FIG. 4B is a schematic sectional view taken along line A-A. First, a first metal wall 10 shaped like a ring is cut out from a first metal pipe having a uniform thickness T1. Furthermore, an opening 10a is formed. The opening 10a is set back from the lower surface 10b of the first metal wall 10 and does not reach the upper surface 10c.

Next, a second metal wall 20 shaped like a ring is cut out from a second metal pipe having a uniform thickness T2 which is thicker than the thickness T1 of the first metal wall 10. A lid part 40 is joined after a radio frequency semiconductor element is bonded to the inside thereof and subjected to e.g. wire bonding.

On the other hand, as shown in FIG. 2, a feed-through part 50 including a line pattern 54 is formed. Here, the order of the step of cutting out a metal wall from a metal pipe and the step of forming a feed-through part 50 may be arbitrary.

The feed-through part 50 is fitted in the opening 10a. Furthermore, the metal base plate 30 is joined to the lower surface 10b of the first metal wall 10. The upper surface 10c of the first metal wall 10 is joined to the lower surface 20a of the second metal wall 20. The metal base plate 30 is joined to the bottom surface 52e of the feed-through part 50. The upper surface 52f and the side surface 52c of the feed-through part 50 are joined to the inner wall 10d of the opening 10a. This joining step can be performed by stacking these members in a die and using e.g. a brazing material such as silver brazing alloy.

Figure 5A:
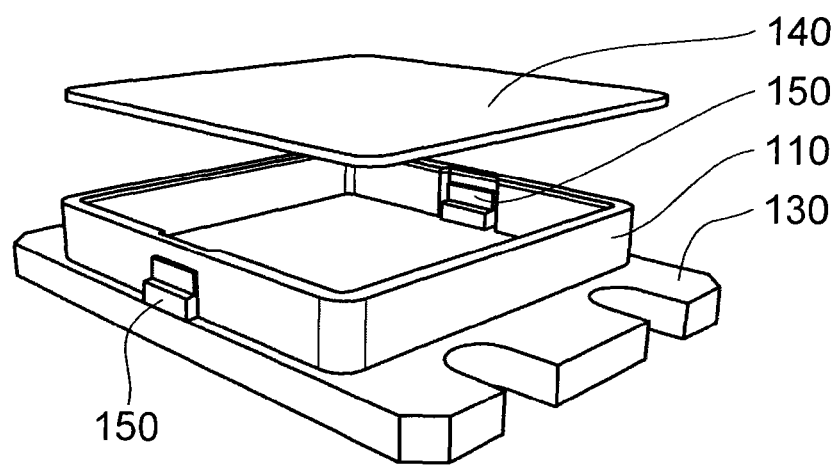
FIG. 5A is a schematic perspective view of a radio frequency semiconductor device package according to a comparative example.
Figure 5B:
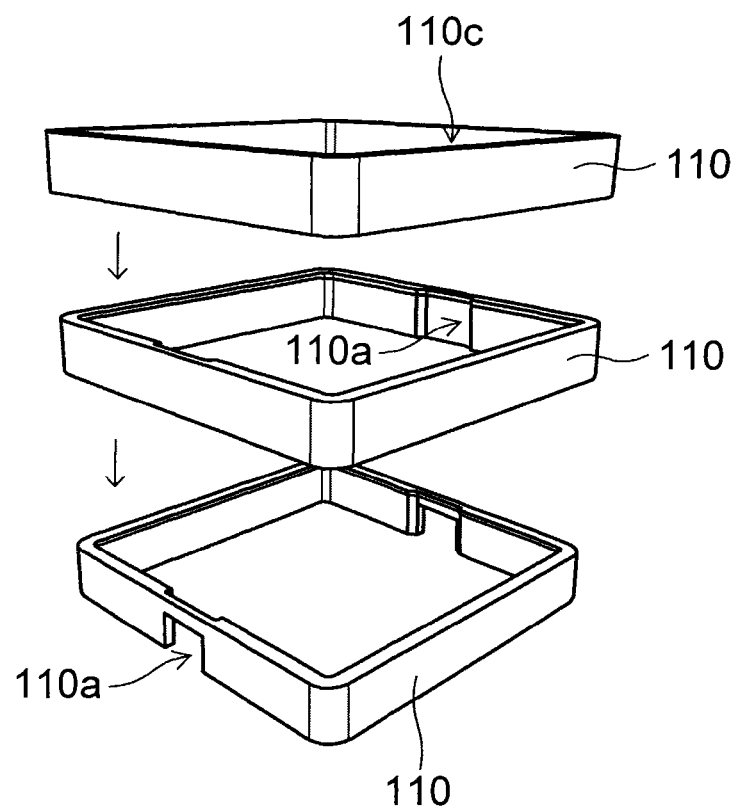
FIG. 5B is a schematic perspective view describing a step of forming a metal wall among the members thereof.

FIG. 5A is a schematic perspective view of a radio frequency semiconductor device package according to a comparative example. FIG. 5B is a schematic perspective view describing the step of forming a metal wall among the members thereof.

A lid part 140 is joined after a radio frequency semiconductor element is bonded to the inside thereof and subjected to e.g. wire bonding. The comparative example includes only one metal wall 110.

The metal wall 110 near the opening 110a in which the feed-through part 150 is to be fitted is shaved more thinly than the other part to suppress the occurrence of parasitic capacitance.

Figure 6A:
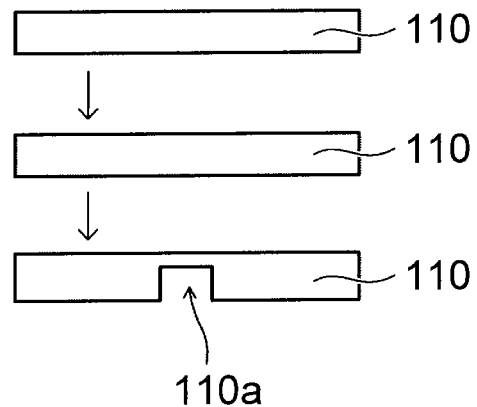
FIG. 6A is a schematic front view describing the step of forming a metal wall of the comparative example.
Figure 6B:
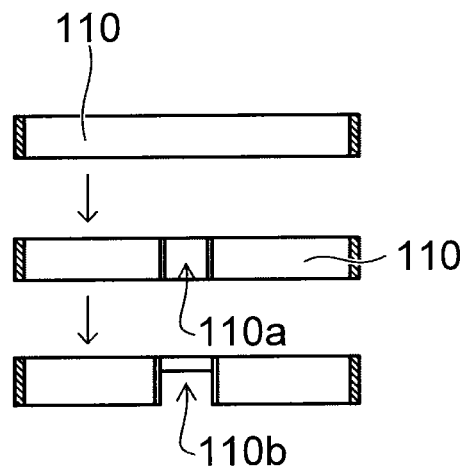
FIG. 6B is a schematic sectional view describing the forming step.
Figure 6C:
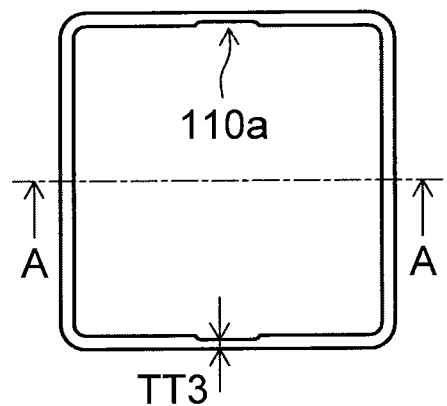
FIG. 6C is a schematic plan view of the metal wall.

FIG. 6A is a schematic front view describing the step of forming a metal wall of the comparative example. FIG. 6B is a schematic sectional view describing the forming step. FIG. 6C is a schematic plan view of the metal wall.

The lid part is joined by e.g. AuSb solder. Here, FIG. 6B is a schematic sectional view taken along line A-A. If the thickness TT3 of the region near the opening 110a formed by shaving the metal wall 110 is so thin, the solder material or the like for joining the lid part to the metal wall 110 may trickle downward. Furthermore, airtight sealing may be difficult. In the comparative example, the thickness TT3 of the shaved region is set to 0.7 mm or more. Because the thickness TT3 of the cut region cannot be set to less than 0.7 mm, the parasitic capacitance of the line pattern 154 increases. Thus, the impedance of the line pattern decreases with the increase of frequency. Accordingly, for instance, impedance matching is difficult at a frequency higher than 5 GHz. This degrades the radio frequency characteristics.

In contrast, in the radio frequency semiconductor device package according to the first embodiment, the thickness of the metal wall around the line pattern 54 can be thinner than 0.7 mm. Thus, the parasitic capacitance C1 can be reduced. This can suppress the decrease of the impedance of the line pattern 54. Thus, the degradation of radio frequency characteristics can be suppressed even at a frequency of 5 GHz or more. Furthermore, the lid part 40 can be reliably jointed with e.g. a solder material to the upper surface of the second metal wall 20 having a large thickness T2. As a result, airtightness is achieved. This can improve reliability.

The first and second metal walls 10, 20 can be cut out from a metal pipe having a simple shape. This enables a radio frequency semiconductor device package superior in volume productivity. Thus, the cost of the radio frequency semiconductor device can be reduced.

Figure 7A:
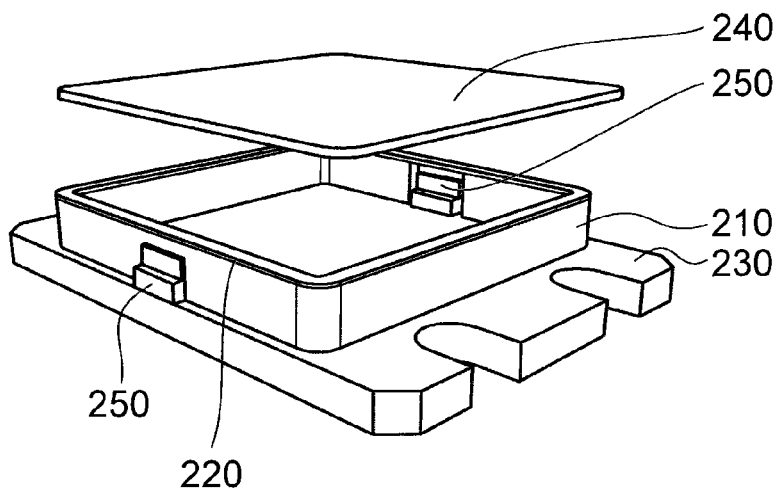
FIG. 7A is a schematic perspective view of a radio frequency semiconductor device package according to a variation of the first embodiment.
Figure 7B:
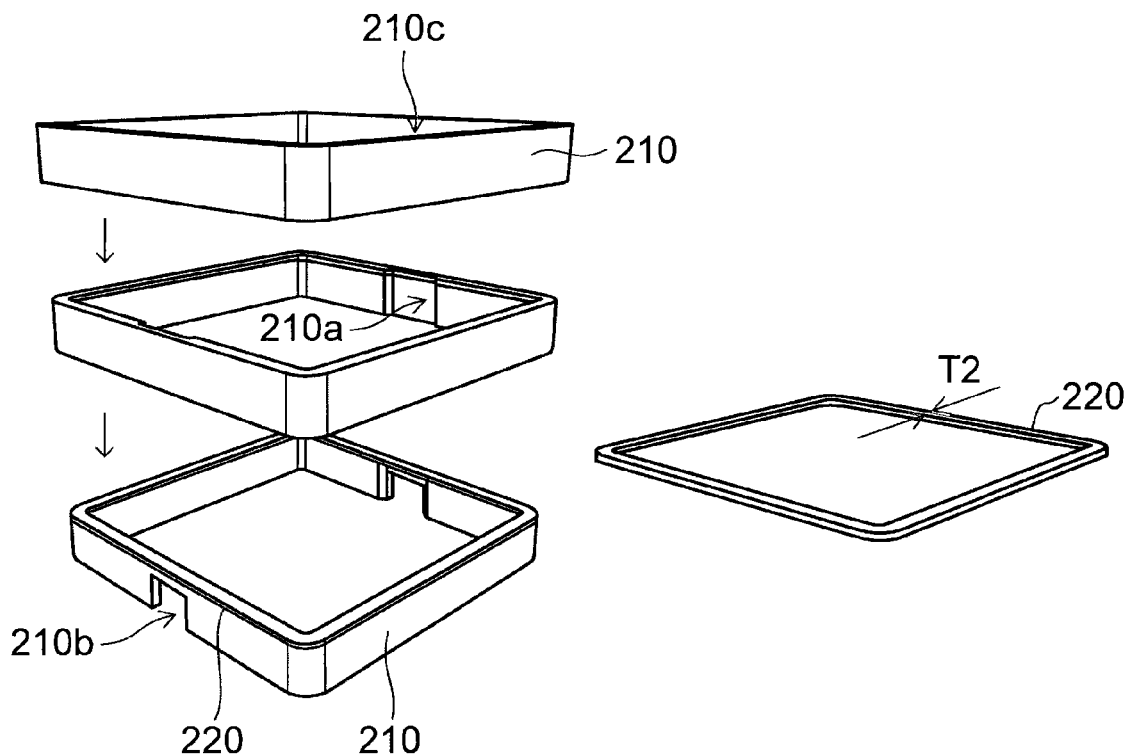
FIG. 7B is a schematic perspective view describing the step of forming a metal wall among the members thereof.

FIG. 7A is a schematic perspective view of a radio frequency semiconductor device package according to a variation of the first embodiment. FIG. 7B is a schematic perspective view describing the step of forming a metal wall among the members thereof.

FIG. 8A is a schematic front view describing the step of forming a metal wall of the variation. FIG. 8B is a schematic sectional view describing the forming step. FIG. 8C is a schematic plan view of the first metal wall. FIG. 8D is a schematic plan view of the second metal wall.

The first metal wall 210 near the opening 210a in which the feed-through part 250 is to be fitted is shaved to a thickness T4 thinner than the other part. Thus, the thickness T4 is made comparable to the thickness in the first embodiment. The second metal wall 220 stacked thereon has a thickness (T2) at which a leakage path is less likely to occur when the lid part 240 is soldered.

Figure 9:
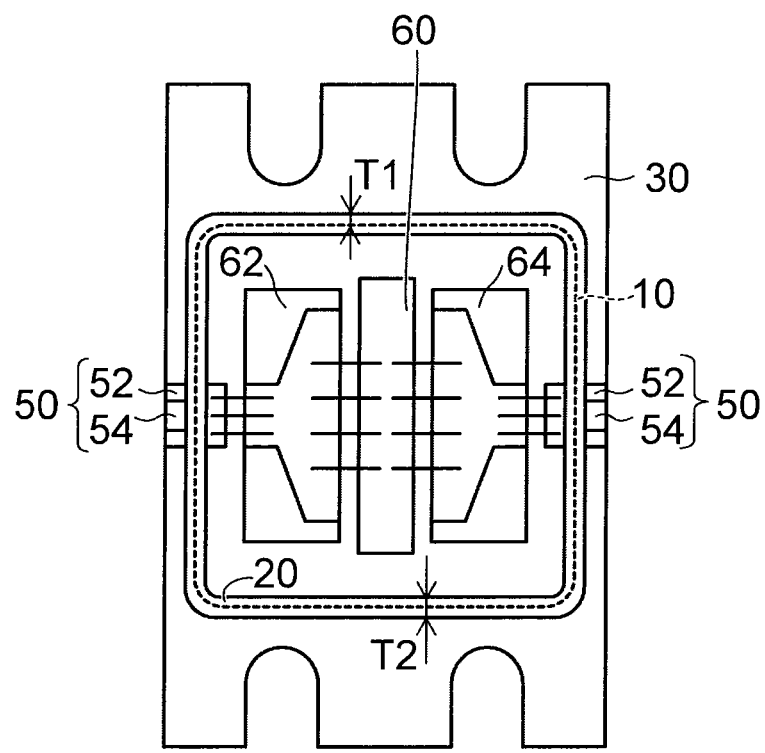
FIG. 9 is a schematic plan view of the inside of the radio frequency semiconductor device based on the radio frequency semiconductor device package according to the first embodiment.

FIG. 9 is a schematic plan view of the inside of the radio frequency semiconductor device based on the radio frequency semiconductor device package according to the first embodiment (the lid part being omitted).

The radio frequency semiconductor device includes a package 5 and a radio frequency semiconductor element 60. The radio frequency semiconductor element 60 can be e.g. a field effect transistor, including HEMT (high electron mobility transistor), made of e.g. AlGaAs/GaAs or InAlGaN/GaN. The radio frequency semiconductor device can further include an input circuit 62 and an output circuit 64.

The line pattern 54 of the feed-through part 50 constitutes micro-strip line structure. On the other hand, the first and second metal walls 10, 20 are fallen to the ground potential. Thus, the line pattern 54 of the feed-through part 50 is surrounded with the first and second metal walls 10, 20 and constitutes a strip line structure. The impedance of the strip line is lower than the impedance of the microstrip line. The impedance of the line pattern 54 surrounded with the first and the second metal walls 10, 20 is smaller than the impedance of the other parts of the line pattern 54. This discontinuity of the impedance of the line pattern 54 can cause the degradation of radio frequency characteristics even at 5 GHz or more.

In the radio frequency semiconductor device of this embodiment, the thickness T1 of the first metal wall 10 is reduced. Thus, the length of the line pattern 54 surrounded with the first and the second metal walls 10, 20 can be decreased. Accordingly, the parasitic capacitance C1 of the line pattern 54 is reduced. This can suppress the degradation of radio frequency characteristics even at 5 GHz or more. Such radio frequency semiconductor devices can be used for radar devices and microwave amplifiers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A radio frequency semiconductor device package comprising:
   a metal base plate;
   a first metal wall provided with first and second openings and connected onto the metal base plate, the first and second openings being set back from a lower surface side of the first metal wall and not reaching an upper surface of the first metal wall,
   a second metal wall connected to the upper surface of the first metal wall, the second metal wall being thicker than the first metal wall;
   a first feed-through part including a first insulator and a first line pattern insulated from the first and second metal walls and joined to an inner wall of the first opening and the metal base plate; and
   a second feed-through part including a second insulator and a second line pattern insulated from the first and second metal walls and joined to an inner wall of the second opening and the metal base plate.

2. The package according to claim 1, wherein the first metal wall is shaped like a ring having a uniform thickness.

3. The package according to claim 1, wherein the second metal wall is shaped like a ring having a uniform thickness.

4. The package according to claim 2, wherein the second metal wall is shaped like a ring having a uniform thickness.

5. The package according to claim 4, wherein the thickness of the second metal wall is larger than the thickness of the first metal wall.

6. The package according to claim 1, wherein
   the second metal wall is shaped like a ring having a uniform thickness,
   the first metal wall is shaped like a ring, and
   thickness of a region except the openings is smaller than the thickness of the second metal wall and larger than thickness of a region between the upper surface and the openings in the first metal wall.

7. The package according to claim 1, wherein the first and second insulators include ceramic.

8. A radio frequency semiconductor device comprising:
   the radio frequency semiconductor device package according to claim 1,
   a semiconductor element provided on the metal base plate and connected to the first and second line patterns; and
   a lid part joined to an upper surface of the second metal wall.

9. The device according to claim 8, wherein the semiconductor element is a field effect transistor.

10. A radio frequency semiconductor device comprising:
    the radio frequency semiconductor device package according to claim 5;
    a semiconductor element provided on the metal base plate and connected to the first line pattern and the second line pattern; and
    a lid part joined to an upper surface of the second metal wall.

11. A radio frequency semiconductor device comprising:
    the radio frequency semiconductor device package according to claim 6;
    a semiconductor element provided on the metal base plate and connected to the first and second line patterns; and
    a lid part joined to an upper surface of the second metal wall.

12. A method for manufacturing a radio frequency semiconductor device package, comprising:
    cutting out a first metal wall shaped like a ring from a first metal pipe, and forming a first opening and a second opening set back from a lower surface and not reaching an upper surface;
    cutting out a second metal wall shaped like a ring from a second metal pipe having a uniform thickness larger than thickness of the first metal wall;
    forming a first feed-through part having a first line pattern and including a first insulator and a second feed-through part having a second line pattern and including a second insulator; and
    joining a metal base plate to the lower surface of the first metal wall, joining the upper surface of the first metal wall to an upper surface of the second metal wall, joining the metal base plate to bottom surfaces of the feed-through parts, and joining upper surfaces and side surfaces of the feed-through parts to inner walls of the openings.

13. The method according to claim 12, further comprising:
shaving neighborhoods of the openings to a thickness smaller than thickness of a region except the neighborhoods of the openings,
wherein the cutting out the second metal wall cuts out from the second metal pipe having a uniform thickness larger than a thickness of the region except the neighborhoods of the openings of the first metal wall.

14. The method according to claim 12, wherein the joining uses silver brazing.

* * * * *